United States Patent
Renninger et al.

(10) Patent No.: US 7,037,786 B2
(45) Date of Patent: May 2, 2006

(54) METHOD OF FORMING A LOW VOLTAGE GATE OXIDE LAYER AND TUNNEL OXIDE LAYER IN AN EEPROM CELL

(75) Inventors: Alan L. Renninger, Cupertino, CA (US); James J. Shen, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 81 days.

(21) Appl. No.: 10/717,149

(22) Filed: Nov. 18, 2003

(65) Prior Publication Data

US 2005/0106817 A1 May 19, 2005

(51) Int. Cl.
*H01L 21/336* (2006.01)
(52) U.S. Cl. ............ 438/264; 438/593; 438/257; 438/258
(58) Field of Classification Search .......... 438/264, 438/315, 257–259, 593–59; 257/315–321, 257/300–305
See application file for complete search history.

(56) References Cited

U.S. PATENT DOCUMENTS

| | | | |
|---|---|---|---|
| 5,254,489 A | 10/1993 | Nakata | 437/40 |
| 5,736,764 A | 4/1998 | Chang | 257/318 |
| 5,882,993 A | 3/1999 | Gardner et al. | 438/591 |
| 6,074,915 A | 6/2000 | Chen et al. | 438/258 |
| 6,238,979 B1 | 5/2001 | Bergemont | 438/264 |
| 6,281,089 B1 | 8/2001 | Chen | 438/315 |
| 6,808,989 B1 * | 10/2004 | Hurley et al. | 438/264 |

* cited by examiner

*Primary Examiner*—Dung A. Le
(74) *Attorney, Agent, or Firm*—Schneck & Schneck; Thomas Schneck

(57) ABSTRACT

A method of fabricating a non-volatile memory embedded logic circuit having a low voltage logic gate oxide layer and tunnel oxide layer is described. Both the low voltage logic gate oxide and the tunnel oxide layers are formed in a single step, thereby reducing the number of overall processing steps needed to form the devices.

22 Claims, 3 Drawing Sheets

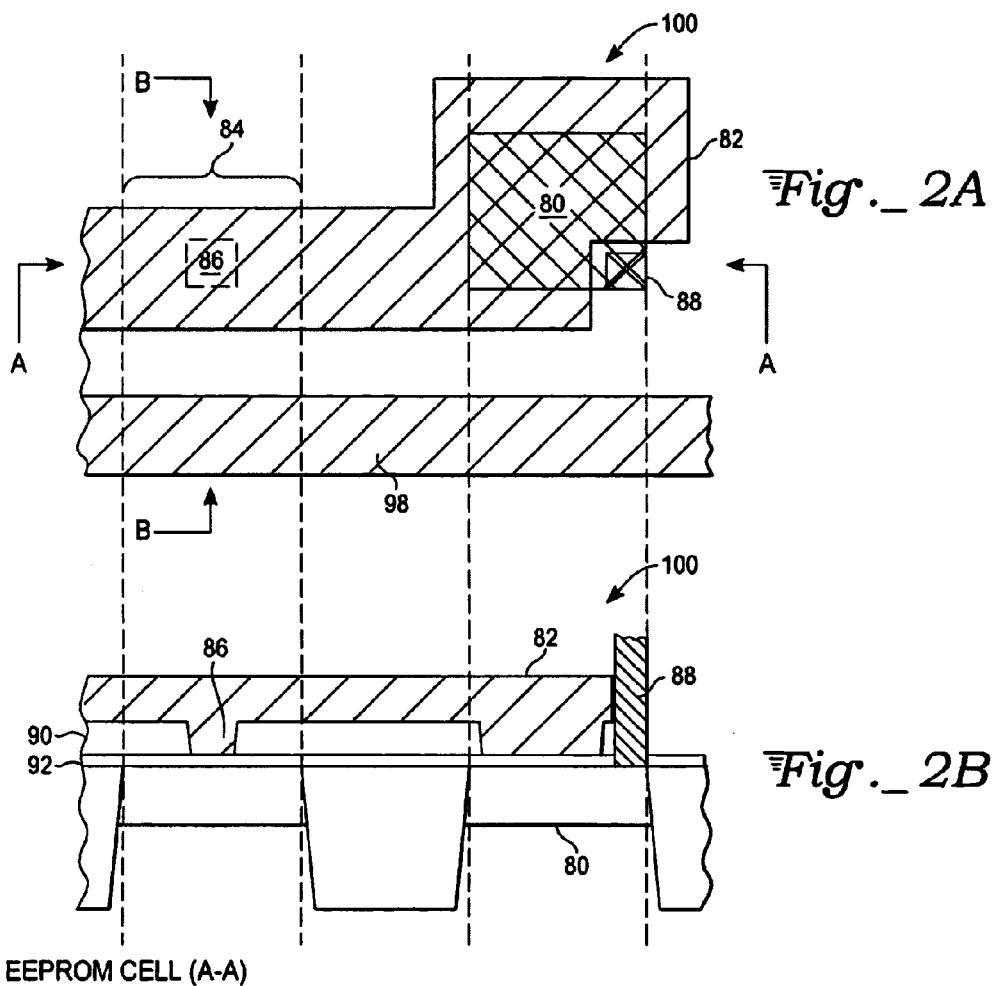
*Fig. 2A*
*Fig. 2B*
EEPROM CELL (A-A)
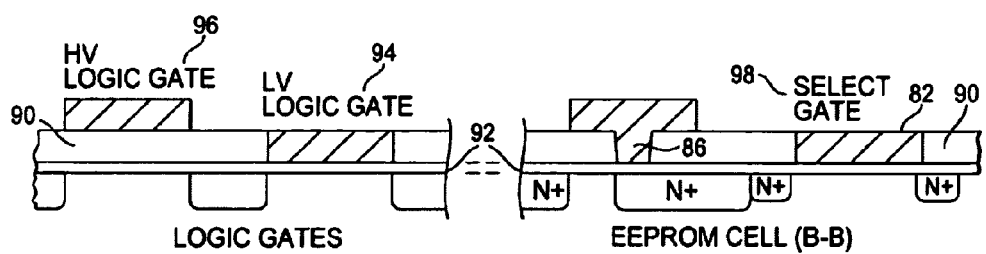
*Fig. 2C*

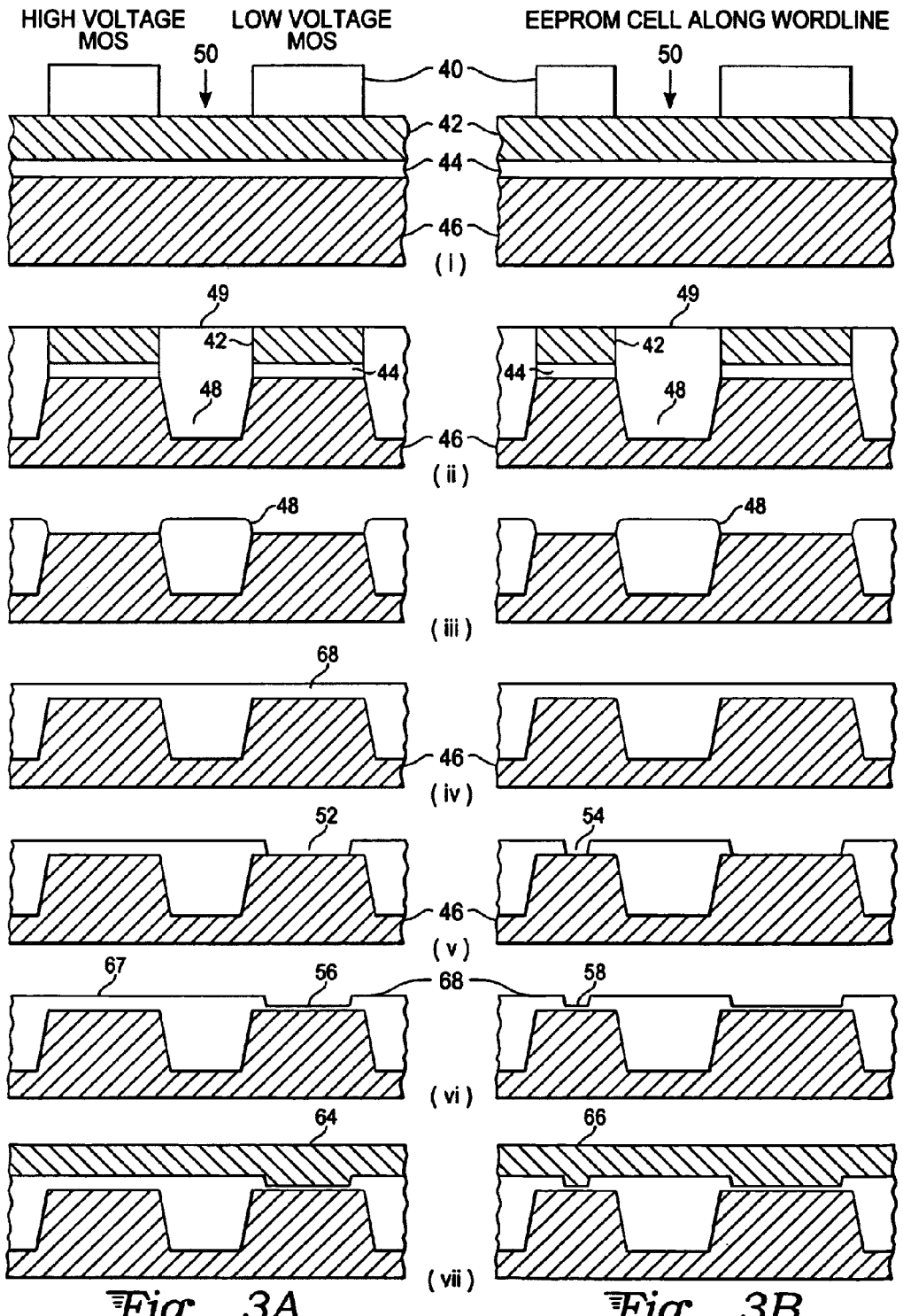
Fig._3A  Fig._3B

METHOD OF FORMING A LOW VOLTAGE GATE OXIDE LAYER AND TUNNEL OXIDE LAYER IN AN EEPROM CELL

TECHNICAL FIELD

The present invention relates generally to the non-volatile memory devices and more particularly to a non-volatile memory embedded logic device.

BACKGROUND ART

Non-volatile memory cells such as EEPROM cells typically have a double-layer polycrystalline silicon ("poly") structure that includes a control gate layer and a floating gate layer. In contrast, semiconductor logic gates, having a control gate only, require only a single polysilicon process to form the control gate layer. To improve computing speed and reduce device size, non-volatile memory cells are sometimes embedded into logic chips. Since processes for forming a non-volatile memory cell and a logic gate are quite different, they are traditionally formed in a separate series of steps.

To reduce a total number of processing steps for a non-volatile memory embedded logic circuit, it is often desirable to form the embedded non-volatile memory cells using a single-layer poly structure. FIG. 1A shows a cross-section of a typical single-layered EEPROM cell 10 dissected along a wordline. FIG. 1B shows a cross-section of the same EEPROM cell 10 dissected along a bitline. With reference to FIG. 1A, a P-channel single poly EEPROM cell 10 is formed in an N-well 14 provided within a P-substrate. With reference to FIG. 1B, the EEPROM cell 10 includes a P-channel select transistor 24 and a P channel storage transistor 26. A first P+diffusion region 28 serves as both a drain for storage transistor 26 and a source for select transistor 24, and a second P+ diffusion region 30, which is coupled to a bitline 36, serves as a drain for select transistor 24. The single-layer polysilicon 20 serves as a floating gate for the storage transistor 26 and a select gate for the select transistor 24. Referring back to FIG. 1A, an application of a bias voltage to a control gate 12 enhances a channel 22 (FIG. 1B) extending between a source 32 and the drain 28 of storage transistor 26, and an application of a bias voltage to the select gate 24 enhances a channel 34 between the source 28 and the drain 30 of select transistor 24.

Referring again to FIG. 1A, a P-type buried diffusion layer serves as the control gate 12 for the EEPROM cell 10. A layer of silicon oxide 18 that is approximately 350 Å thick is provided between the floating gate 20 and the control gate 12. A tunnel oxide layer 16 that is about 70 Å thick lies between the floating gate 20 and the N-well 14. The single-poly silicon EEPROM cell 10 is programmed, erased, and read in a manner similar to that of a double-poly silicon cell. That is, programming is accomplished by electron tunneling from the floating gate 20 to the substrate 14 through the tunnel oxide 16 while erasing is realized by electrons tunneling from the substrate 14 to the floating gate 20.

Although the single poly silicon process described above allows the formation of a single polysilicon layer for both the floating gates of non-volatile memory cells and the control gates of the logic cells in the same step, the oxide layer underneath the polysilicon layer has to be formed in separate steps because its thickness varies throughout the embedded circuit. For instance, the thickness of a typical gate oxide layer for a low voltage logic gate is approximately 130 Å for 5 V systems, 50 Å for 2.5 V systems and 30 Å for 1.8 V systems. On the other hand, the tunnel oxide layer and the oxide layer between the floating gate and the control gate of a EEPROM cell is typically around 70 Å thick. Because the oxide layer thickness of the logic cells and the EEPROM cells are so different, they are typically formed in separate steps. For instance, U.S. Pat. No. 6,238,979 to Bergemont teaches an embedment of EEPROM cells in a logic device by forming the EEPROM cells first, followed by masking the completed EEPROM cells to form logic gates. It would be desirable to have an embedded circuit structure and a method for forming the structure that would allow the formation of the oxide layer for both the logic gate and the non-volatile memory cell in one step, thereby eliminating the need to form the EEPROM cells and the logic gates separately.

DISCLOSURE OF THE INVENTION

The present invention teaches the formation of a non-volatile memory embedded logic circuit having three types of active areas: one for the non-volatile memory cells, one for low voltage logic gates, and one for high voltage logic gates. The low voltage logic gate and the non-volatile memory cell having an oxide layer of essentially the same thickness while the high voltage logic gate has an oxide layer that is thicker. The embedded memory structure disclosed herein allows the forming of the non-volatile memory gate oxide layer and the logic gate oxide layer in a single step, thereby reducing manufacturing time.

BRIEF DESCRIPTION OF THE DRAWINGS

FIG. 2A shows a top view of a single-polysilicon EEPROM cell according to one exemplary embodiment of the present invention.

FIG. 2B shows a cross-sectional view of the single-polysilicon EEPROM cell shown in FIG. 2A taken along line A—A.

FIG. 2C shows a cross-sectional view of the single-polysilicon EEPROM cell shown in FIG. 2A taken along line B—B, a cross-sectional view of a low voltage logic gate cell, and a high voltage logic gate cell of the present invention.

FIG. 3A shows the step-by-step formation of a low voltage logic gate and a high voltage logic gate according to the preferred embodiment of the present invention.

FIG. 3B shows the step-by-step formation of a single-polysilicon non-volatile memory cell according to the preferred embodiment of the present invention.

MODES FOR CARRYING OUT THE INVENTION

Figure 1A:
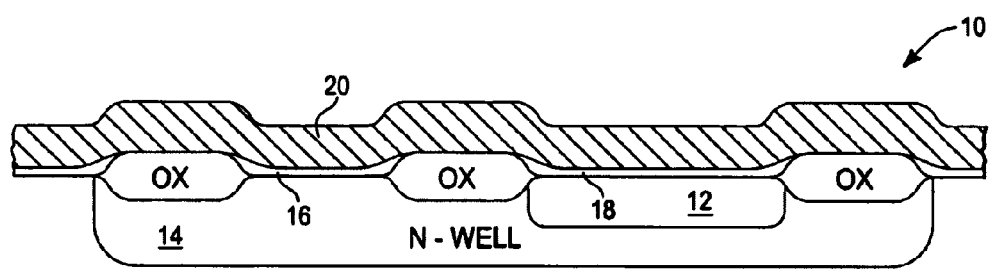
FIG. 1A shows a cross section of a prior art single-polysilicon non-volatile memory dissected along a wordline.
Figure 1B:
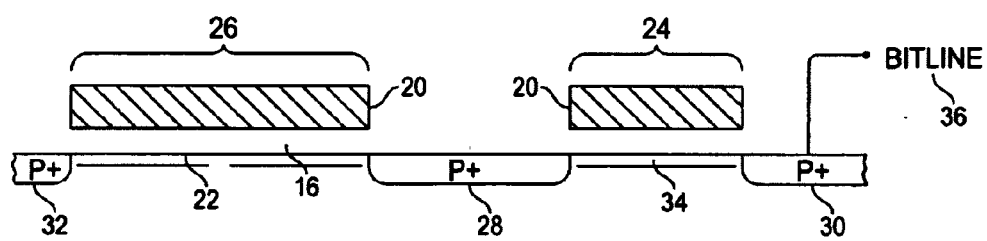
FIG. 1B shows a cross section of the prior art single-polysilicon non-volatile memory dissected along a bit line.

In FIG. 2A, a top view of an EEPROM cell 100 according to an exemplary embodiment of the present invention is shown. A cross-sectional view of the EEPROM cell 100 taken along the wordline (segmenting line A—A) is shown in FIG. 2B. A cross-sectional view of the EEPROM cell 100 taken along the bitline (segmenting line B—B) is shown alongside a high voltage logic gate 96 and a low voltage logic gate 94 in FIG. 2C.

With reference to FIGS. 2A–2C, the EEPROM cell 100 is made up of a buried control gate 80, a floating gate 82, and a tunneling region 84 comprised of a tunneling extension 86 below the floating gate 82. The control gate 80 is connected to a voltage source through a tungsten plug 88. There are basically two oxide layers throughout the whole embedded circuit: a thick oxide layer 90 for the high voltage logic gate 96 and the select gate 98, and a thinner oxide layer 92 for a tunnel oxide of the EEPROM cell 100 and the low voltage logic gate 94.

Exemplary process steps for simultaneously forming the EEPROM cell 100 and the logic gates 94, 96, 98 are shown in FIGS. 3A and 3B. FIG. 3A shows the steps for making a high voltage MOS transistor and a low voltage MOS transistor. FIG. 3B shows the steps for making an EEPROM cell as seen in a cross-sectional view taken along a wordline. Although not shown in the figures for purposes of brevity and clarity, it will be understood that various other processing steps may be performed in between the steps shown. These steps may include, for example, ion implantation steps to form various N-well and P-well regions and the formation of tungsten plugs to the control gates.

In step (i), a pad oxide layer 44 is formed above a semiconductor substrate 46. A nitride layer 42 is deposited on top of the pad oxide layer 44. Next, a patterned photoresist layer 40 is formed above the nitride layer 42. The nitride layer 42, pad oxide layer 44, and substrate 46 are etched, so as to produce an exposed area 50 where an isolation structure is to be formed.

The isolation structure surrounds and electrically isolates individual device areas in which logic cells and embedded memory cells are built. Though the isolation structure shown in subsequent figures is of the Shallow Trench Isolation (STI) type, it is also possible to use other isolation methods such as Local Oxidation of Silicon (LOCOS). In an STI process, the isolation structure is formed by etching a shallow trench through a nitride layer 42 and pad oxide 44 and into an exposed substrate area, for example to a depth of about 4000 Å, and then filled or thermally grown, for example with silicon dioxide, using a deposition or growth process according to methods known to one skilled in the art. In step (ii), a shallow trench 48 is formed by an etch of the exposed area 50, followed by an oxide fill step that fills the shallow trench with, for example, silicon dioxide. A subsequent planarization process, using the nitride layer 42 as a natural stop, removes or polishes off any excess silicon dioxide material, forming a leveled oxide plateau 49 on top of the STI structure 48. As an example, the polishing step may be a chemical mechanical planarization (CMP) process.

In step (iii), the nitride layer 42 and the pad oxide layer 44 are sequentially removed to form an STI isolation structure 48 shown. The STI isolation structure is formed to electrically separate adjacent device areas. A variety of adjacent and non-adjacent device structures may now be formed.

Next, as shown in FIGS. 3A and B at step (iv), a high voltage (HV) gate oxide layer 68, for example having an approximate 250 Å thickness, is formed over the substrate 46. The oxide layer 68 is masked with a patterned photoresist. The exposed part of the oxide layer 68 is then etched to reveal portions of the underlying substrate 46 as shown in step (v). Next, in exposed areas 52, 54, a second or subsequent, thinner oxide layer will be formed. The formation of the first or second oxide layer may be carried out by thermal oxidation of the substrate, chemical vapor deposition, or atomic layer deposition. As shown in step (vi), a first device area will be used to form an EEPROM tunnel oxide layer 58, a second device area will be used to form a low voltage logic gate oxide layer 56, and a third device area will be used to form a high voltage logic gate oxide layer 67. Referring to FIG. 2B, an N+ region may be developed in the EEPROM cell area to form a control gate 80. The LV gate oxide layer 56 and the tunnel oxide layer 58 each, for example, approximately 70 Å thick, have been formed on the exposed portions 52, 54 of the substrate 46. This layer of thin gate oxide 56, 58 serves as a gate oxide 56 for the low voltage (LV) logic gate and a tunnel oxide 58 for the EEPROM cell respectively. The low voltage logic gate oxide layer 56 may have essentially the same thickness as the tunnel oxide layer 58.

Although the present invention has been described in terms of specific exemplary embodiments, one skilled in the art will realize that other embodiments may be readily envisioned that are still the present invention. Therefore, the present invention shall be limited in scope only by the appended claims.

What is claimed is:

1. A method for forming a non-volatile memory embedded logic circuit comprising the steps of:
    providing a semiconductor substrate;
    forming an isolation structure on said semiconductor substrate to isolate a first device area, a second device area, and a third device area;
    forming a first oxide layer on said first, second, and third device areas simultaneously, said first oxide layer providing a high voltage logic gate oxide layer in said second device area;
    etching said first oxide layer in said first and third device areas to expose said substrate;
    forming a second oxide layer in said first device area simultaneously with said third device area, providing a tunnel oxide layer in said first device area, a low voltage logic gate oxide layer in said third device area; and
    forming a floating gate layer on top of said first oxide layer.

2. The method of claim 1, wherein said isolation structure is formed by a shallow trench isolation method.

3. The method of claim 1, wherein said isolation structure is formed by a local oxidation of silicon method.

4. The method of claim 1, wherein said first oxide layer is formed by thermal oxidation.

5. The method of claim 1, wherein said first oxide layer is formed by chemical vapor deposition.

6. The method of claim 1, wherein said first oxide layer is formed by atomic layer deposition.

7. The method of claim 1, wherein said first oxide layer is formed to approximately 250 Å thick.

8. The method of claim 1, wherein said second oxide layer is formed to approximately 70 Å thick.

9. The method of claim 1, wherein said floating gate layer is a doped polysilicon layer.

10. The method of claim 1, wherein said second oxide layer is formed by thermal oxidation.

11. The method of claim 1, wherein said second oxide layer is formed by chemical vapor deposition.

12. The method of claim 1, wherein said second oxide layer is formed by atomic layer deposition.

13. A method for forming a non-volatile memory embedded logic circuit comprising the steps of:
    providing a semiconductor substrate;
    forming an isolation structure on said semiconductor substrate to define a first device area and a second device area;

forming a first oxide layer on said first and second device areas simultaneously, said first oxide layer forming a high voltage logic gate oxide layer in said second device area;

etching said first oxide layer in said first device area to expose said substrate;

forming a second oxide layer in said first device area, providing a tunnel oxide layer in said first device area; and forming a floating gate layer on top of said second oxide layers.

14. The method of claim 13, wherein said first oxide layer is formed by thermal oxidation.

15. The method of claim 13, wherein said second oxide layer is formed to approximately 70 Å thick.

16. The method of claim 13, wherein said floating gate layer is a doped polysilicon layer.

17. The method of claim 13, wherein said first oxide layer is formed by chemical vapor deposition.

18. The method of claim 13, wherein said first oxide layer is formed by atomic layer deposition.

19. The method of claim 13, wherein said second oxide layer is formed by thermal oxidation.

20. The method of claim 13, wherein said second oxide layer is formed by chemical vapor deposition.

21. The method of claim 13, wherein said second oxide layer is formed by atomic layer deposition.

22. The method of claim 13, wherein said first oxide layer is approximately 250 Å thick.

* * * * *